(12) United States Patent
Yamamoto

(10) Patent No.: US 8,599,392 B2
(45) Date of Patent: Dec. 3, 2013

(54) MULTIFUNCTION DEVICE INCLUDING SOUND GENERATOR THAT INCREASES SOUND VOLUME DURING CALL

(75) Inventor: Hiroyuki Yamamoto, Kasugai (JP)

(73) Assignee: Brother Kogyo Kabushiki Kaisha, Nagoya-shi, Aichi-ken (JP)

( * ) Notice: Subject to any disclaimer, the term of this patent is extended or adjusted under 35 U.S.C. 154(b) by 493 days.

(21) Appl. No.: 12/908,632

(22) Filed: Oct. 20, 2010

(65) Prior Publication Data

US 2011/0142246 A1    Jun. 16, 2011

(30) Foreign Application Priority Data

Dec. 10, 2009   (JP) .................................. 2009-280143
Oct. 5, 2010    (JP) .................................. 2010-225494

(51) Int. Cl.
*G06F 15/00*    (2006.01)
(52) U.S. Cl.
USPC ........................................................ 358/1.13

(58) Field of Classification Search
USPC ....................................................... 358/1.13
See application file for complete search history.

(56) References Cited

U.S. PATENT DOCUMENTS

2005/0182622 A1     8/2005  Kawasaki et al.
2007/0253005 A1*   11/2007  Ola et al. ........................ 358/1.1

FOREIGN PATENT DOCUMENTS

| JP | H06-189051 A | 7/1994 |
| JP | 2001-024814 A | 1/2001 |
| JP | 2005-117162 A | 4/2005 |
| JP | 2006-103095 A | 4/2006 |

* cited by examiner

*Primary Examiner* — Saeid Ebrahimi Dehkordy
(74) *Attorney, Agent, or Firm* — Baker Botts L.L.P.

(57) ABSTRACT

A multifunction device includes a communication unit that establishes a communication with a remote device through a circuit, and a sound generator that generates a sound during the communication. An image forming unit performs an operation for forming an image, and a control unit controls the sound generator to increase a volume of the sound while the image forming unit is performing the operation.

9 Claims, 3 Drawing Sheets

Table TB

| EXECUTION SPEED | FULL SPEED | MEDIUM SPEED | SUSPENSION |
|---|---|---|---|
| SOUND VOLUME | HIGH | MEDIUM | LOW |

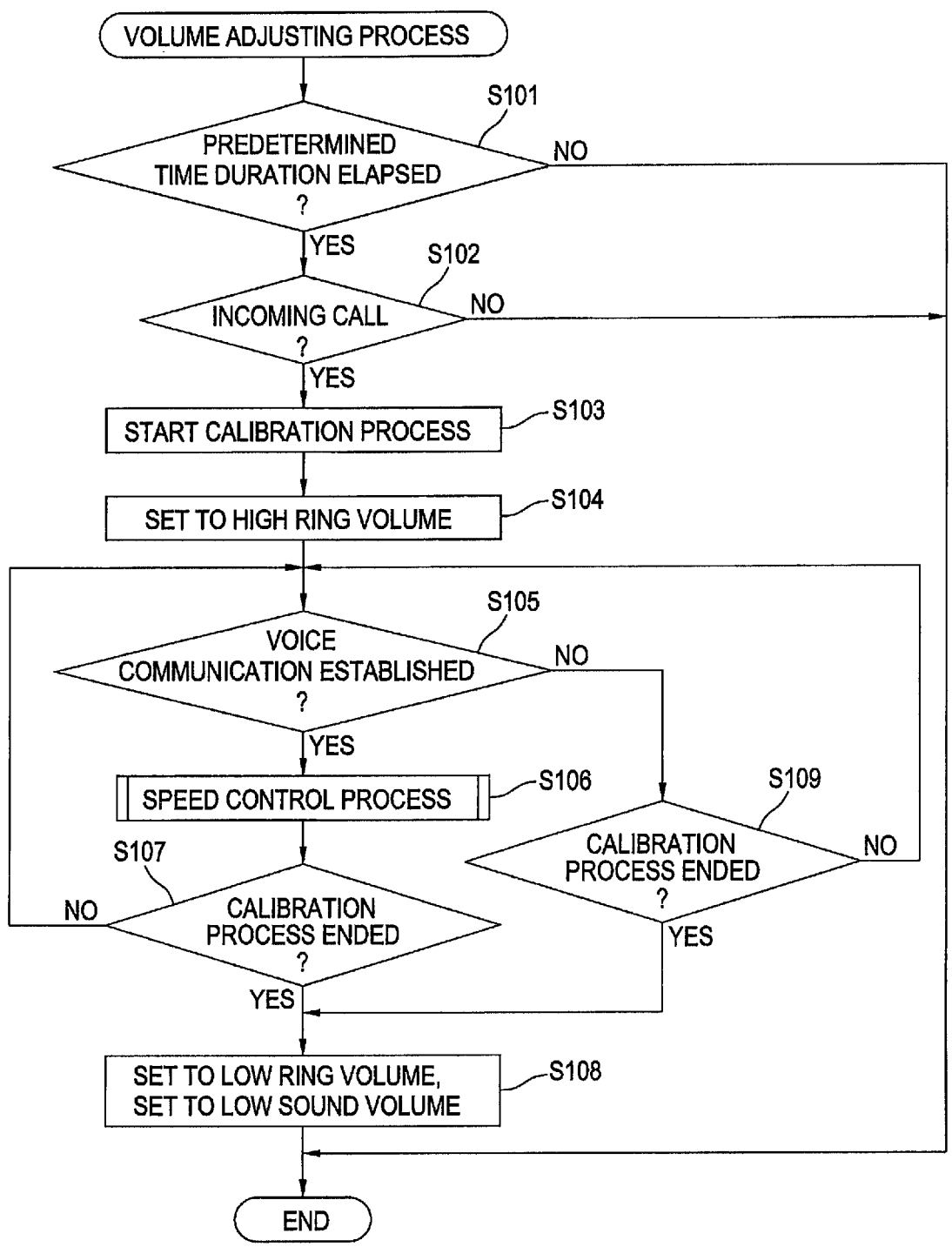

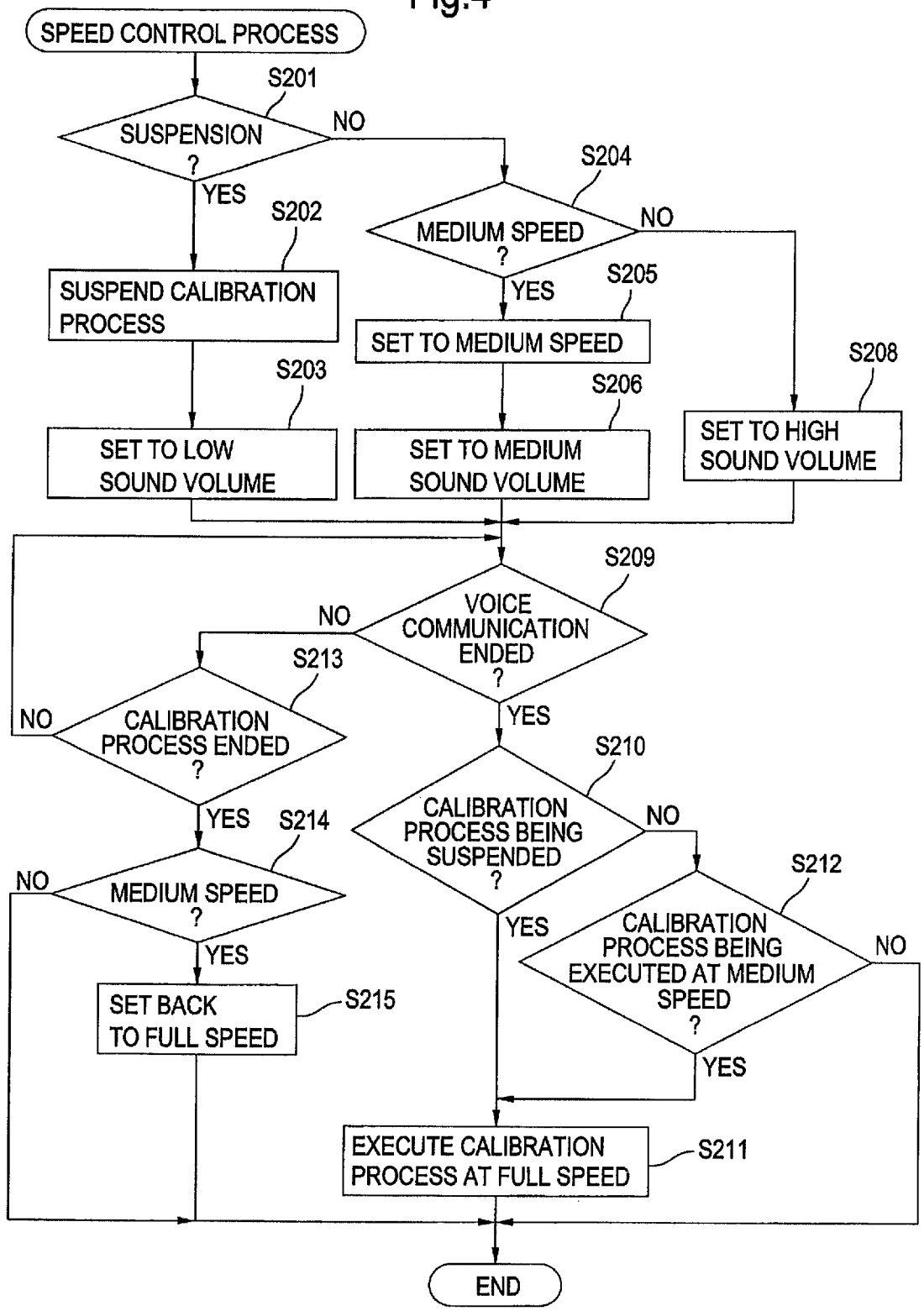

MULTIFUNCTION DEVICE INCLUDING SOUND GENERATOR THAT INCREASES SOUND VOLUME DURING CALL

CROSS REFERENCE TO RELATED APPLICATION

This application claims priority from Japanese Patent Applications No. 2009-280143 filed Dec. 10, 2009 and No. 2010-225494 filed Oct. 5, 2010. The entire content of each of these priority applications is incorporated herein by reference.

TECHNICAL FIELD

The present invention relates to a multifunction device having both a telephone function and an image forming function.

BACKGROUND

There has been provided a facsimile device having a telephone function and capable of executing both an image forming function and the telephone function concurrently. For example, there is a facsimile device that performs printing on a regular sheet, such as scratch paper, when a predetermined key is pressed during a call.

SUMMARY

However, noise generated during printing makes it hard to hear such sound as a phone ring and a voice on the other end of the line.

In view of the foregoing, it is an object of the invention to provide a multifunction device that raises the volume of the sound in accordance with the magnitude of the noise during printing so as to enable a user to hear the phone ring and the like more easily.

In order to attain the above and other objects, the invention provides a multifunction device including a communication unit that establishes a communication with a remote device through a circuit, a sound generator that generates a sound during the communication, an image forming unit that performs an operation for forming an image, and, a control unit that controls the sound generator to increase a volume of the sound while the image forming unit is performing the operation.

According to another aspect, the present invention provides a multifunction device including a communication unit that establishes a communication with a remote device through a circuit, a sound generator that generates a sound during the communication, an image forming unit that executes an operation for forming an image with printing material based on data, and a control unit that controls the sound generator to generate the sound with a first volume when the image forming unit is not executing the operation and to generate the sound with a second volume greater than the first volume when the image forming unit is executing the operation.

According to still another aspect, the present invention provides a multifunction device including a communication unit that establishes a communication with a remote device through a circuit, a first sound generator that generates a sound during the communication, an image forming unit that executes an operation for forming an image with printing material based on data, and a control unit that controls the first sound generator to generate the sound with a first volume when the image forming unit is not executing the operation, to generate the sound with a second volume greater than the first volume when the image forming unit is performing the operation at a first speed, and to generate the sound with a third volume greater than the second volume when the image forming unit is performing the operation at a second speed faster than the first speed.

BRIEF DESCRIPTION OF THE DRAWINGS

The particular features and advantages of the invention as well as other objects will become apparent from the following description taken in connection with the accompanying drawings, in which:

FIG. 3 is a flowchart representing a volume adjusting process according to the embodiment of the invention; and FIG. 4 is a flowchart representing a speed control process according to the embodiment of the invention.

DETAILED DESCRIPTION

Figures 1, 2:
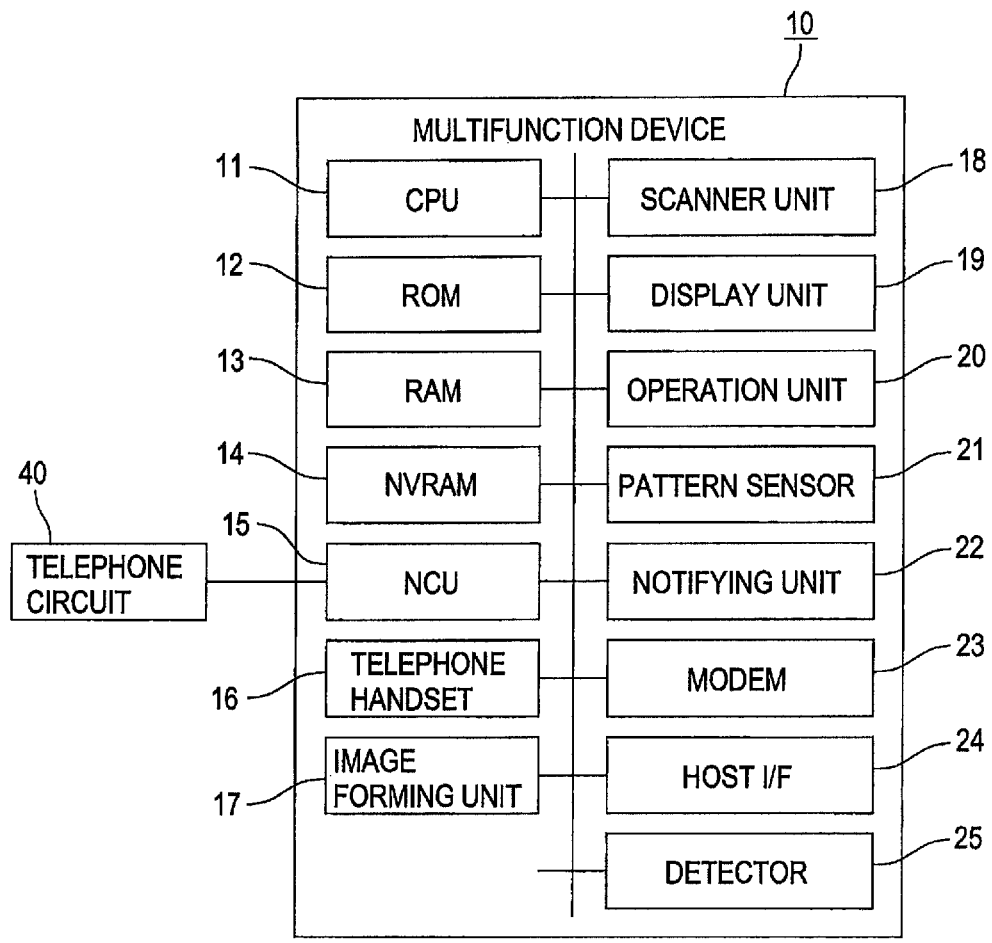
FIG. 1 is a block diagram showing an electrical configuration of a multifunction device according to an embodiment of the invention.
FIG. 2 is an example of a table showing settings of sound volumes and execution speeds according to the embodiment of the invention.

A multifunction device 10 according to an embodiment of the invention will be described while referring to the accompanying drawings.

The multifunction device 10 has a telephone function, a printer function, a copier function, a scanner function, a facsimile function, and the like. As shown in FIG. 1, the multifunction device 10 includes a CPU 11, a ROM 12, a RAM 13, a non-volatile memory (NVRAM) 14, a network control unit (NCU) 15, a telephone handset 16, an image forming unit 17, a scanner unit 18, a display unit 19, an operation unit 20, a pattern sensor 21, a notifying unit 22, a modem 23, a host interface (host I/F) 24, a detector 25, and the like, all of which are connected to one another.

The ROM 12 stores programs for executing various operations in the multifunction device 10, including a volume adjusting process to be described later. The CPU 11 (volume control unit, determining unit) controls each component of the multifunction device 10 in accordance with the programs retrieved from the ROM 12 while storing process results into either the RAM 13 or the NVRAM 14.

The NCU 15 (communication unit) has one end connected to a telephone circuit 40 and the other end connected to the telephone handset 16 (sound generator), the notifying unit 22 (sound generator), and the like. The telephone handset 16 enables a voice communication between the multifunction device 10 and a remote telephone set through the telephone circuit 40. In this embodiment, "during a call" means "during a voice communication between the multifunction device 10 and the remote telephone set."

The telephone handset 16 is configured to generate sound of voice on the other end of the line with one of a high sound volume, a medium sound volume, and a low sound volume. The multifunction device 10 is formed with a bracket (not shown) for receiving the telephone handset 16, and the bracket is provided with the detector 25, which detects whether or not the telephone handset 16 is mounted in the bracket. For example, mounting the telephone handset 16 in the bracket may displace the detector 25 to a retracted position, enabling the detector 25 to detect the presence of the telephone handset 16 in the bracket, and removing the telephone handset 16 from the bracket may displace the detector 25 to an advanced position, enabling the detector 25 to detect the absence of the telephone handset 16 in the bracket.

The notifying unit 22 notifies a user of an incoming call by ringing, generating light, or through the display unit 19 or the like, and is configured to keep ringing (or generating sound or the like) until a voice communication is established. In this embodiment, the notifying unit 22 is configured of a speaker that generates a phone ring with either a high ring volume or a low ring volume.

It should be noted that in this description "a communication with a remote device" is defined as to be established upon reception of an incoming call, and "sound generated during the communication" includes the phone ring generated by the notifying unit 22 and the voice sound generated by the telephone handset 16.

Although not shown in the drawings, the image forming unit 17 includes a belt unit, a charger, a processing unit, and a fixing unit, and is configured to form color images on a sheet of paper with printing material (ink or toner) of a plurality of different colors. The scanner unit 18 scans over an original and generates image data.

The display unit 19 includes a display and lamps (neither is shown), and is capable of displaying various setting screens and operation status of the multifunction device 10. The operation unit 20 has a plurality of buttons (not shown) for enabling a user to input various instructions. The pattern sensor 21 detects patterns printed by the image forming unit 17 during a calibration process to be described next.

The multifunction device 10 is configured to perform the calibration process so as to improve image quality. In this embodiment, the calibration process includes a density calibration process and a printing position calibration process. In the density calibration process, the image forming unit 17 forms, based on pattern data, density patterns of respective colors on such component as a belt or a drum, and the density of each density pattern is measured with the pattern sensor 21. Then, calibration is performed based on the measured densities so as to realize an appropriate image density in the printing operations. In the printing position calibration process, on the other hand, the image forming unit 17 forms patterns of respective colors on such component as a belt or a drum, and the pattern sensor 21 detects each pattern, and an offset in a printing position of each pattern is calculated. Then, calibration is performed such that images are formed at appropriate positions in the printing operations. In this embodiment, "an operation for forming an image" includes both "an operation for forming an image on a sheet with printing material" and "an operation for forming patterns during the calibration process on such component as a belt or a drum with printing material".

In this embodiment, the calibration process is executed once each time a predetermined time interval has elapsed since the calibration process was executed last time. Also, each time the calibration process is executed, the time of the execution is recorded in the NVRAM 14. However, the calibration process may be alternatively executed once each time printing is performed on a predetermined number of sheets.

The NVRAM 14 stores a flag and various settings relating to the calibration process and also a table TB shown in FIG. 2. The flag is turned to "0" when the calibration process is executed, and turned to "1" when the predetermined time interval has elapsed after the calibration process was executed last time. The predetermined time interval is 10 hours, for example. As shown in FIG. 2, the table TB indicates correspondence between execution speeds of the calibration process and sound volumes, i.e., volumes of the voice sound generated by the telephone handset 16. The user can select a desired execution speed from among a full speed, a medium speed, and a suspension speed. Depending on the selected execution speed, the calibration process during a call is executed at the full speed or the medium speed or suspended as described later. The selection of the user for the execution speed is stored in the NVRAM 14 as one of the various settings.

In this embodiment, these volumes of the voice sound are preset and inalterable. However, it may be configured such that only the low sound volume can be altered by a user and that the high and medium sound volumes are automatically adjusted based on the altered low sound volume so as to be larger than the medium and low sound volumes, respectively.

Next, the volume adjusting process executed in the multifunction device 10 will be described with reference to the flowchart of FIG. 3. The volume adjusting process is repeatedly executed by the CPU 11 at fixed intervals after the multifunction device 10 is activated, for example.

As shown in FIG. 3, first in S101, the CPU 11 determines whether or not the predetermined time interval has elapsed since the calibration process was executed last time, by determining whether or not the flag stored in the NVRAM 14 is "1." If not (S101:No), then the CPU 11 ends the volume adjusting process. On the other hand, if so (S101:Yes), then in S102 the CPU 11 determines whether or not an incoming call is received, i.e., whether or not the notifying unit 22 has started generating the phone ring. Note that the CPU 11 controls the notifying unit 22 to generate the phone ring when an incoming call is received through the NCU 15. If not (S102:Not), then the CPU 11 ends the volume adjusting process. On the other hand, if so (S102:Yes), then in S103 the CPU 11 starts execution of the calibration process at the full speed, and proceeds to S104.

In S104, the CPU 11 sets the ring volume to the high ring volume. As a result, the notifying unit 22 generates the phone ring with the high ring volume. Then in S105 the CPU 11 determines whether or not a voice communication is established. Here, the CPU 11 determines that a voice communication is established when the detector 25 is shifted to the advanced position by a user removing the telephone handset 16 from the bracket after the NCU 15 receives the incoming call. If a voice communication is established (S105:Yes), then in S106 the CPU 11 executes a speed control process, which will be described next with reference to the flowchart of FIG. 4.

In FIG. 4, first in S201 the CPU 11 determines whether or not the execution speed selected by the user is the suspension speed, by referring to the NVRAM 14. If so (S201:Yes), then the CPU 11 suspends execution of the calibration process in S202. More specifically, in S202, the CPU 11 outputs to the image forming unit 17 a command to change the execution speed to the suspension speed. Receiving this command, the image forming unit 17 changes the execution speed of the calibration process to the suspension speed, resulting in suspension of the calibration process.

Then, in S203, the CPU 11 sets the sound volume to the low sound volume corresponding to the suspension speed (see FIG. 2). More specifically, the CPU 11 refers to the table TB and determines the low sound volume which is corresponding to the suspension speed. Then, the CPU 11 outputs to the telephone handset 16 a command to set the sound volume to the low sound volume. Receiving this command, the telephone handset 16 sets the sound volume to the low sound volume, and generates the voice sound with the low sound volume. Then, the CPU 11 proceeds to S209.

On the other hand, if a negative determination is made in S201 (S201:No), then in S204 the CPU 11 determines whether or not the execution speed selected by the user is the medium speed by referring to the NVRAM 14. If so (S204: Yes), then in S205 the CPU 11 changes the execution speed to the medium speed and continues the calibration process at the medium speed. More specifically, the CPU 11 outputs to the image forming unit 17 a command to change the execution speed to the medium speed. Receiving this command, the image forming unit 17 changes the execution speed of the calibration process to the medium speed, and continues the calibration process at the medium speed.

Note that the medium speed is a speed lower than the full speed where the belt unit of the image forming unit 17 is operated at a highest speed. Reducing the operation speed of the belt unit lowers the execution speed of the calibration process, thereby lowering noise generated in the multifunction device 10 during the calibration process.

Then in S206 the CPU 11 sets the sound volume to the medium sound volume corresponding to the medium speed by referring to the table TB (see FIG. 2). More specifically, the CPU 11 refers to the table TB and determines the medium sound volume which corresponds to the selected medium speed. Then, the CPU 11 outputs to the telephone handset 16 a command to set the sound volume to the medium sound volume. Receiving this command, the telephone handset 16 sets the sound volume to the medium sound volume, and generates the voice sound with the medium sound volume. Then, the CPU 11 proceeds to S209.

If a negative determination is made in S204 (S204:No), this means that the high sound volume is selected by the user. Thus, the CPU 11 continues the calibration process at the full speed. In S208, the CPU 11 sets the sound volume to the high sound volume. More specifically, the CPU 11 refers to the table TB (FIG. 2) and confirms that the high sound volume is set in correspondence with the full speed. Then, the CPU 11 outputs to the telephone handset 16 a command to set the sound volume to the high sound volume. Receiving this command, the telephone handset 16 sets the sound volume to the high sound volume, and generates the voice sound with the high sound volume. Then, the CPU 11 proceeds to S209.

In S209, the CPU 11 determines whether or not the voice communication is ended. If not (S209:No), then the CPU 11 determines in S213 whether or not the calibration process is ended. If not (S213:No), then the CPU 11 returns to S209.

On the other hand, if the voice communication is ended (S209:Yes), then the CPU 11 determines in S210 whether or not the calibration process is suspended. If so (S210:Yes), then in S211 the CPU 11 sets the execution speed to the full speed, and controls the image forming unit 17 to execute (resume) the calibration process at the full speed. Then, the CPU 11 ends the speed control process. However, if not (S210:No), then the CPU 11 determines in S212 whether or not the current execution speed is the medium speed. If so (S212:Yes), then the CPU 11 proceeds to S211. On the other hand, if not (S212:No), this means that the calibration process is being executed at the full speed, and the CPU 11 ends the speed control process.

If it is determined in S213 that the calibration process is ended (S213:Yes), then the CPU 11 determines in S214 whether or not the medium speed is selected as the execution speed by the user by referring to the NVRAM 14. If not (S214:No), then the CPU 11 ends the speed control process. On the other hand, if so (S214:Yes), then the CPU 11 sets the execution speed to the full speed in S215, and then ends the speed control process.

After the speed control process, in S107 of FIG. 3, the CPU 11 determines whether or not the calibration process is ended. If not (S107:No), then the CPU 11 returns to S105. On the other hand, if so (S107:Yes), then in S108 the CPU 11 sets the ring volume and the sound volume to the low ring volume and the low sound volume, respectively, so that the telephone handset 16 and the notifying unit 22 generate the voice sound and the phone ring with the small sound volume and the small ring volume when the calibration process is not executed. Then, the CPU 11 ends the volume adjusting process.

Note that if a certain period of time (20 hours, for example) longer than the predetermined time interval has elapsed after the calibration process was executed last time, the CPU 11 immediately executes the calibration process, without regard to whether an incoming call is received. This is because a high-quality image cannot be guaranteed if the calibration process is not executed for more than the certain period of time. In other words, if no incoming call is received for the certain period of time, then the calibration process is automatically started without waiting for an incoming call.

As described above, the ring volume or the sound volume during the calibration process is automatically increased, enabling a user to hear the phone ring or the voice sound more easily.

Also, because the increased volume is automatically returned to the lower volume upon ending of the calibration process, it is possible to avoid generation of an unnecessarily loud sound when the calibration process is not executed.

Further, the sound volume is increased less when the execution speed is lower. That is, the volume of the voice sound is adjusted depending on the magnitude of the noise during the calibration process. This configuration enables the user to hear the voice sound generated by the telephone handset 16 more easily without excessively increasing the sound volume.

Moreover, the decreased execution speed is increased to the full speed upon ending of the voice communication, so as to end the calibration process as quickly as possible.

The calibration process is executed automatically when a predetermined condition is met, without regard to a user's intention, and it is difficult for the user to know the timing of when the calibration process is executed. Thus, the user may be annoyed with the noise of the calibration process if the calibration process is executed at night, for example. However, because the calibration process is started at the same time as the notifying unit 22 starts ringing, the phone ring and the noise of the calibration process are generated at the same time. In other words, the noise of the calibration process is not generated during the quiet time between phone ring generated upon receiving an incoming call and another phone ring generated upon receiving a following incoming call. Therefore, the user can have a longer quiet time at night or the other time of day. Also, if a user let the answering machine pick up while the user is out, the multifunction device 10 executes the calibration process that generates noise while the notifying unit 22 generates the phone ring a predetermined number of times. Thus, it is unnecessary to give a separate time to execute the calibration process that generates noise. Also, because the calibration process started at the above mentioned timing is completed as quickly as possible, it is unnecessary to execute the calibration process before an image forming process, making it possible to start the image forming process immediately upon reception of a printing command, without executing the calibration process.

Also, although the calibration process is executed automatically when the predetermined condition is met without waiting for a user command, the user can have a conversation on a phone as usual by having the calibration process suspended. Also, in this case, the suspended calibration process is resumed after the voice communication is over, so the calibration process can be completed as soon as possible.

While the invention has been described in detail with reference to the embodiment thereof, it would be apparent to those skilled in the art that various changes and modifications may be made therein without departing from the spirit of the invention.

For example, in the above-described embodiment, a desired execution speed during a call is selected by a user from among the full speed, the medium speed, and the suspension speed. However, it is possible to set one of these speeds as a default speed for the case that the user does not make any selection.

In the above-described embodiment, the table TB and other various settings are stored in the NVRAM 14, but may alternatively stored in any other non-volatile storing medium, such as a HDD.

The present invention is also applicable to various other types of multifunction device as long as the multifunction device has the telephone function and the printer function. For example, the multifunction device may be an electrophotographic image forming device or an inkjet-type image forming device having the telephone function. Also, the multifunction device may be a monochrome image forming device having the telephone function without the scanner function, the copier function, or the facsimile function.

Also, the process of S102 of the flowchart shown in FIG. 3 may be omitted. That is, in the above-described embodiment, the calibration process is started in S103 only if the predetermined time duration has elapsed (S101:Yes) and if the incoming call is received (S102:Yes). However, the embodiment may be modified such that the CPU 11 always starts the calibration process (S103) if the predetermined time duration has elapsed (S101:Yes), even if there is no incoming call.

The present invention is also applicable for an image forming operation. More specifically, in the above-described embodiment, the CPU 11 starts the calibration process in S103 only if the predetermined time duration has elapsed (S101:Yes) and the incoming call is received (S102:Yes). However, in this modification, the process of S102 of FIG. 3 is omitted, and the CPU 11 controls the image forming unit 17 to perform an image forming operation for forming images based on print data at the full speed if the CPU 11 receives a print command. Also, in the speed control process of S106, the CPU 11 controls the execution speed of the image forming process instead of the execution speed of the calibration process. With this configuration, if an incoming call is received while the image forming operation is executed, the notifying unit 22 generates the ring volume with the high ring volume. Thus, a user can hear the phone ring even when the image forming operation is being executed, which is convenient to the user.

In the above-described embodiment, the execution speed is determined based on the user's selection. However, it is possible to determine the execution speed in different methods. For example, even when the full speed corresponding to the high volume is selected as the execution speed by the user, the execution speed may be set to the medium speed and the sound volume may be set to the medium sound volume when a relatively large amount of image data needs to be processed. This configuration may be realized as follows.

That is, the CPU 11 determines an execution speed (S201, 5204, for example) at which the calibration process can be executed, based on the size and the like of the pattern data which is to be printed during the calibration process and stored in the RAM 13 or the like. Then, the CPU 11 determines a sound volume capable of enabling a user to hear the voice sound while the calibration process is executed at the determined execution speed. This configuration is useful especially when the invention is applied for the image forming operation as described above. For example, assuming that the CPU 11 initially sets the execution speed of the image forming operation to the full speed and sets the sound volume to the high sound volume, if the execution speed is decreased to the medium speed because print data to be processed is relatively large in size, the CPU 11 decreases the sound volume to the medium sound volume. The CPU 11 alternates between detection of the execution speed and detection of the sound volume, and sets to a sound volume suited for the execution speed.

What is claimed is:

1. A multifunction device comprising:
   a communication unit that establishes a communication with a remote device through a circuit;
   a sound generator that generates a sound during the communication;
   an image forming unit that performs an operation for forming an image; and
   a control unit that controls the sound generator to increase a volume of the sound while the image forming unit is performing the operation,
   wherein the control unit controls the image forming unit to decrease a speed of the operation to a lower speed while the sound generator is generating the sound, and
   wherein the control unit controls the image forming unit to increase the speed of the operation to a higher speed upon ending of the sound generation by the sound generator.

2. The multifunction device according to claim 1, wherein the control unit controls the sound generator to decrease the volume of the sound upon ending of the operation.

3. The multifunction device according to claim 1, wherein the control unit controls the sound generator to increase the volume of the sound less when the image forming unit performs the operation at a lower speed.

4. The multifunction device according to claim 1, further comprising a determining unit that determines whether the sound generator has started generating the sound, wherein the image forming unit starts the operation when the determining unit determines that the sound generator has started generating the sound.

5. The multifunction device according to claim 1, wherein the operation is a calibration process executed for improving image quality.

6. The multifunction device according to claim 1, wherein the operation is an image forming operation for forming the image based on print data executed upon reception of a print command.

7. The multifunction device according to claim 6, wherein:
   the image forming unit further performs a calibration process for improving image quality when a predetermined condition is met; and
   when the control unit detects that the sound generator is generating the sound while the image forming unit is performing the calibration process, the control unit controls the image forming unit to suspend the calibration process without controlling the sound generator to increase the volume of the sound.

8. The multifunction device according to claim 7, wherein the control unit controls the image forming unit to resume the suspended calibration process upon ending of the sound generation by the sound generator.

9. A multifunction device comprising;
a communication unit that establishes a communication with a remote device through a circuit;
a first sound generator that generates a sound during the communication;
an image forming unit that executes an operation for forming an image with printing material based on data;
a control unit that controls the first sound generator to generate the sound with a first volume when the image forming unit is not executing the operation, to generate the sound with a second volume greater than the first volume when the image forming unit is performing the operation at a first speed, and to generate the sound with a third volume greater than the second volume when the image forming unit is performing the operation at a second speed faster than the first speed; and
a second sound generator that starts generating a phone ring when an incoming call is received, wherein the control unit controls the image forming unit to start executing the operation while the second sound generator is generating the phone ring, wherein the operation is a calibration process for enhancing image quality,
wherein the control unit controls the second sound generator to generate the phone ring with a fourth volume when the image forming unit is executing the calibration process, and the fourth volume is higher than a fifth volume with which the second sound generator generates the phone ring when the image forming unit is not executing the calibration process.

* * * * *